United States Patent
Wu

(10) Patent No.: US 8,850,298 B2
(45) Date of Patent: Sep. 30, 2014

(54) COMBINED KOETTER-VARDY AND CHASE DECODING OF CYCLIC CODES

(75) Inventor: Yingquan Wu, Palo Alto, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 168 days.

(21) Appl. No.: 13/534,287

(22) Filed: Jun. 27, 2012

(65) Prior Publication Data

US 2014/0006896 A1   Jan. 2, 2014

(51) Int. Cl.
*H03M 13/00* (2006.01)

(52) U.S. Cl.
USPC .......................................... 714/782; 714/784

(58) Field of Classification Search
USPC .......... 714/794, 751, 801, 780, 755, 784, 782
See application file for complete search history.

(56) References Cited

U.S. PATENT DOCUMENTS

| | | | |
|---|---|---|---|
| 6,634,007 B1 | 10/2003 | Koetter et al. | 714/784 |
| 7,159,168 B2 * | 1/2007 | Whinnett et al. | 714/794 |
| 7,191,376 B2 * | 3/2007 | Yedidia | 714/751 |
| 7,519,898 B2 * | 4/2009 | Narayanan et al. | 714/801 |
| 7,590,924 B2 | 9/2009 | Au et al. | 714/785 |
| 7,793,195 B1 | 9/2010 | Wu | 714/781 |
| 8,074,156 B2 * | 12/2011 | Yokokawa et al. | 714/794 |
| 2009/0158127 A1 * | 6/2009 | Miyauchi et al. | 714/780 |
| 2009/0158128 A1 | 6/2009 | Yokokawa et al. | 714/780 |
| 2013/0305114 A1 * | 11/2013 | Olcay et al. | 714/755 |

OTHER PUBLICATIONS

Koetter, Ralf, et al., "Algebraic Soft-Decision Decoding of Reed-Solomon Codes", IEEE Transactions on Information Theory, vol. 49, No. 11, Nov. 2003, pp. 2809-2825.

Chase, David, "A Class of Algorithms for Decoding Block Codes With Channel Measurement Information", IEEE Transactions on Information Theory, vol. IT-18, No. 1, Jan. 1972, pp. 170-182.

Wu, Yingquan, "New List Decoding Algorithms for Reed-Solomon and BCH Codes", IEEE Transactions on Information Theory, vol. 54, No. 8, Aug. 2008, pp. 3611-3630.

Nguyen, Phong S., et al., "On Multiple Decoding Attempts for Reed-Solomon Codes: A Rate-Distortion Approach", IEEE Transactions on Information Theory, vol. 57, No. 2, Feb. 2011, pp. 668-691.

* cited by examiner

*Primary Examiner* — David Ton
(74) *Attorney, Agent, or Firm* — Christopher P. Maiorana, PC

(57) ABSTRACT

An apparatus having a first circuit and a second circuit is disclosed. The first circuit may be configured to generate (i) a plurality of symbols and (ii) a plurality of decision values both in response to detecting an encoded codeword. The second circuit may be configured to (i) generate a plurality of probabilities to flip one or more of the symbols based on the decision values, (ii) generate a modified probability by merging two or more of the probabilities of an unreliable position in the symbols and (iii) generate a decoded codeword by decoding the symbols using an algebraic soft-decision technique in response to the modified probability.

20 Claims, 9 Drawing Sheets

US 8,850,298 B2

COMBINED KOETTER-VARDY AND CHASE DECODING OF CYCLIC CODES

FIELD OF THE INVENTION

The present invention relates to decoding cyclic codes generally and, more particularly, to a method and/or apparatus for implementing a combined Koetter-Vardy and Chase decoding of cyclic codes.

BACKGROUND OF THE INVENTION

Efficient list decoding beyond half a minimum distance for Reed-Solomon and Bose and Ray-Chaudhuri (i.e., BCH) codes were first devised in 1997 and later improved almost three decades after the inauguration of an efficient hard-decision decoding method. In particular, for a given Reed-Solomon code C(n,k,d), a Guruswami-Sudan decoding method corrects up to $n(1-\sqrt{1-d/n})$ errors, which effectively achieves a Johnson bound, a general lower bound on the number of errors to be corrected under a polynomial time for any code. Koetter and Vardy showed a way to translate soft-decision reliability information provided by a channel into a multiplicity matrix that is directly involved in the Guruswami-Sudan method. The resulting method substantially outperforms the Guruswami-Sudan method. Koetter et al. introduced a computational technique, based upon re-encoding and coordinate transformation, that reduces the complexity of a bivariate interpolation procedure. Justesen derived a condition for successful decoding using the Koetter-Vardy method for soft-decision decoding by introducing a few assumptions. Lee and O'Sullivan devised an algebraic soft-decision decoder for Hermitian codes. The algebraic soft-decision decoder follows a path set out by Koetter and Vardy for Reed-Solomon codes while constructing a set of generators of a certain module from which a Q-polynomial is extracted using the Gröbner conversion method.

Augot and Couvreur extended the Guruswami-Sudan method to achieve q-ary Johnson bounds, $$\frac{q-1}{q}n\left(1 - \sqrt{1 - \frac{q}{q-1}\frac{d}{n}}\right),$$

for subfield subcodes of Reed-Solomon codes by distributing multiplicities across an alphabet of the q-ary subfield. However, the authors give only an asymptotic proof and fail to provide explicitly the minimum multiplicities to achieve the Johnson bound. Wu presented a new list decoding method (i.e., Wu method) for Reed-Solomon and binary BCH codes. The Wu method casts the list decoding as a rational curve fitting problem utilizing the polynomials constructed by the Berlekamp-Massey method. The Wu method achieves the Johnson bound for both Reed-Solomon and binary BCH codes. Beelen showed that the Wu method can be modified to achieve the binary Johnson bound for binary Goppa codes. We also showed that when a part of the positions are pre-corrected, the Wu method "neglects" the corrected positions and subsequently exhibits a larger list error correction capability (i.e., LECC) with smaller effective code length. A scenario of partial pre-correction is during the iterative decoding of product codes, where each row (column) component word is partially corrected by the preceding column (row) decoding, herein miscorrection is ignored. Pyndiah demonstrated that the iterative decoding of product codes achieves a near Shannon limit.

It would be desirable to implement a combined Koetter-Vardy and Chase decoding of cyclic codes.

SUMMARY OF THE INVENTION

The present invention concerns an apparatus having a first circuit and a second circuit. The first circuit may be configured to generate (i) a plurality of symbols and (ii) a plurality of decision values both in response to detecting an encoded codeword. The second circuit may be configured to (i) generate a plurality of probabilities to flip one or more of the symbols based on the decision values, (ii) generate a modified probability by merging two or more of the probabilities of an unreliable position in the symbols and (iii) generate a decoded codeword by decoding the symbols using an algebraic soft-decision technique in response to the modified probability.

The objects, features and advantages of the present invention include providing a combined Koetter-Vardy and Chase decoding of cyclic codes that may (i) merge two or more most reliable flipping estimations of an unreliable position into a single estimation, (ii) add two probabilities prior to base multiplicity assignments, (iii) combine Chase decoding with Koetter-Vardy decoding, (iv) decode BCH codewords and/or (v) decode Reed-Solomon codewords.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally enhance bounds of a Guruswami-Sudan technique (or method or process) by converting a presumed number of list correctable errors into a posteriori probabilities. A minimum multiplicity assignment (in real numbers) for the Guruswami-Sudan technique may be utilized to achieve a q-ary Johnson bound, $$\frac{q-1}{q}n\left(1 - \sqrt{1 - \frac{q}{q-1}\frac{d}{n}}\right).$$

where n and d generally denote the code length and the designed minimum distance, respectively. A fraction of positions may be pre-corrected. Subsequently, with appropriate multiplicity assignments, the a decoder may treat the code as a shortened code by truncating the pre-corrected positions. In particular, if n* is a remaining number of uncertain positions, the resulting list decoding radius achieves a shortened length q-ary Johnson bound, $$\frac{q-1}{q}n^*\left(1-\sqrt{1-\frac{q}{q-1}\frac{d}{n^*}}\right),$$

which may converge to the minimum distance d as an effective code length n* is reduced toward to the (nontrivial) q-ary minimum code length $$\frac{q}{q-1}d.$$

Some multiplicities (in real numbers) may achieve any list error correction capability (e.g., LECC) within the q-ary Johnson bound. The LECC bound may be enhanced by incorporating a modulation method, including binary phase-shift keying (e.g., BPSK) and quadrature amplitude modulation (e.g., QAM) modulations. The derivative bounds are generally beyond the q-ary Johnson bound. A combination of Chase flipping and Koetter-Vardy varying multiplicities may also be utilized.

Figure 1:
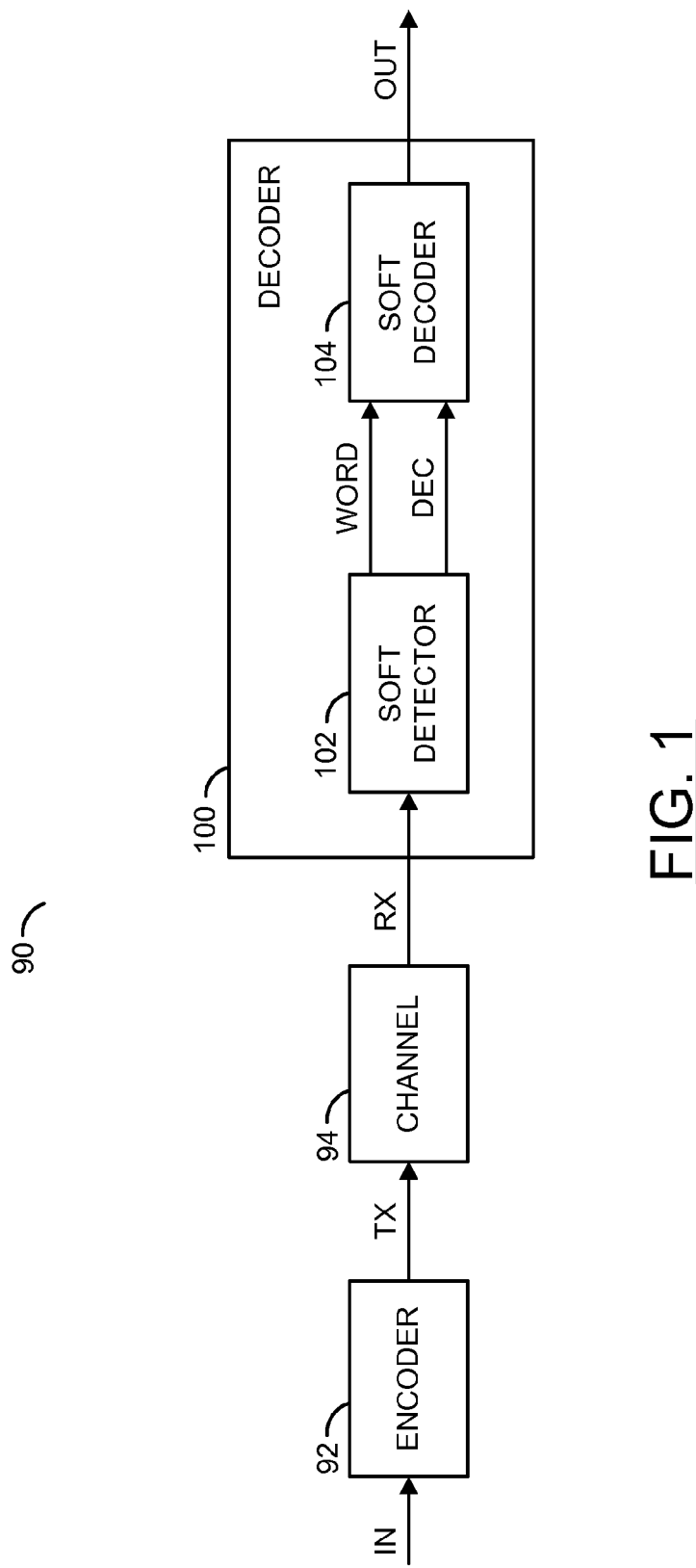
FIG. 1 is a block diagram of a communication system.

Referring to FIG. 1, a block diagram of a communication system (or apparatus) 90 is shown. The system 90 generally comprises a block (or circuit) 92, a block (or circuit) 94 and a block (or circuit) 100. The circuit 100 generally comprises a block (or circuit) 102 and a block (or circuit) 104. The circuits 92 to 104 may represent modules and/or blocks that may be implemented as hardware, software, a combination of hardware and software, or other implementations.

A signal (e.g., IN) may be received by the circuit 92. The signal IN may implement an input signal carrying codewords (or words or symbols or bits) to be encoded and transferred/stored. The circuit 92 may generate a signal (e.g., TX) received by the circuit 94. The signal TX may implement a transmit signal that conveys the encoded codewords from the signal IN. A signal (e.g., RX) may be generated by the circuit 94 and received by the circuit 100/102. The signal RX may implement a received signal. In the absence of errors, the codewords in the signal RX may match the codewords in the signal TX. The circuit 102 may generate a signal (e.g., WORD) received by the circuit 104. The signal WORD may carry a received codeword (or bits or symbols) detected in the signal RX. A signal (e.g., DEC) may also be generated by the circuit 102 and received by the circuit 104. The signal DEC may convey decisions about the received codewords in the signal RX. A signal (e.g., OUT) may be generated by the circuit 104/100. The signal OUT may implement an output signal that contains the decoded codeword (or word or symbols or bits).

The circuit 92 may implement an encoder circuit. The circuit 92 is generally operation to encode the codewords received in the signal IN. The encoding may be a cyclic code encoding, a Bose and Ray-Chaudhuri (e.g., BCH) encoding or a Reed-Solomon encoding. The encoded codewords may be presented in the signal TX.

The circuit 94 may implement a communication channel. The circuit 94 is generally operational to carry the encoded codewords communicated from the circuit 92 to the circuit 100. The circuit 94 may also carry data communicated from the circuit 100 to the circuit 92. Implementations of the circuit 94 may include, but are not limited to, one or more transmission medium such as air, wire, optical fibre, Ethernet and the like. In some embodiments of the present invention, the circuit 94 may implement a storage medium. Storage media may include, but is not limited to, optical media, magnetic media and electronic media.

The circuit 100 may implement a receiver circuit. The circuit 100 is generally operational to decode the encoded codewords received in the signal RX. The decoding may include a soft detection and a soft decode. The received and decoded codewords may be presented in the signal OUT.

The circuit 102 may implement a soft detector circuit. The circuit 102 is generally operational to detect the codewords received in the signal RX using a soft decision and/or a hard decision. The detected codewords may be presented in the signal WORD. Decision values corresponding to the detected codewords may be presented in the signal DEC.

The circuit 104 may implement a soft decoder circuit. The circuit 104 is generally operational to decode the codewords received in the signal WORD based on the decision values received in the signal DEC. The soft decoding may include, but is not limited to, (i) generating a plurality of probabilities to flip one or more of the symbols within the codewords based on said decision values, (ii) generating a modified probability by merging two or more of the probabilities of an unreliable position in the symbols and (iii) generating the decoded codeword by decoding the symbols using an algebraic soft-decision technique in response to the modified probability. In some embodiments, the probabilities may be generated using a Chase technique. The algebraic soft-decision technique generally comprises a Koetter-Vardy technique. The encoded codewords may comprise Reed-Solomon codewords or BCH codewords.

Figure 2:
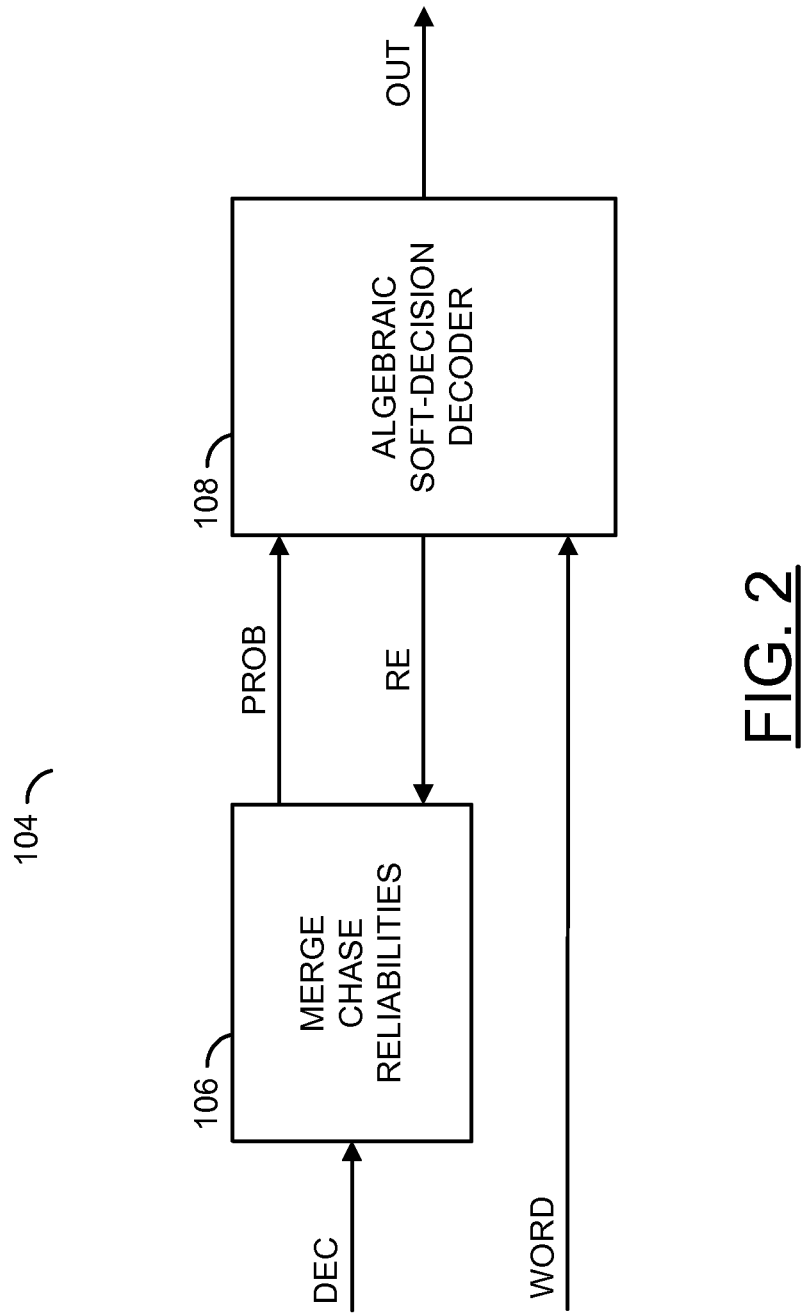
FIG. 2 is a block diagram of an example implementation of a soft decoder circuit in accordance with a preferred embodiment of the present invention.

Referring to FIG. 2, a block diagram of an example implementation of the circuit 104 is shown in accordance with a preferred embodiment of the present invention. The circuit 104 generally comprises a block (or circuit) 106 and a block (or circuit) 108. The circuits 106 to 108 may represent modules and/or blocks that may be implemented as hardware, software, a combination of hardware and software, or other implementations.

The signal DEC may be received by the circuit 106. The signal WORD may be received by the circuit 108. A signal (e.g., PROB) may be generated by the circuit 106 and presented to the circuit 108. The signal PROB generally conveys probability values for flipping bits or symbols in the received codewords in the signal WORD. A signal (e.g., RE) may be generated by the circuit 108 and received by the circuit 106. The signal RE may convey re-encoded data generated during the decoding of the codewords in the signal WORD. The signal OUT may be generated by the circuit 108.

The circuit 106 may implement a merge circuit. The circuit 106 is generally operational to generate the probabilities to flip one or more of the symbols/bits in the codewords based on the decision values in the signal DEC. The circuit 106 may also be operational to generate a modified probability by merging two or more of the probabilities of an unreliable position in the symbols/bits. In some embodiments, the merging may merge Chase reliabilities created by the Chase technique. The Chase technique is generally described in the paper, "A class of algorithms for decoding block codes with channel measurement information", IEEE Trans. Inform.

Theory, vol. 18, pp. 170-182, January 1972, which is hereby incorporated by reference in its entirety. The merged reliabilities may be presented as a merged matrix in the signal PROB.

The circuit 108 may implement an algebraic soft-decision decoder circuit. The circuit 108 is generally operational to generate the decoded codewords by decoding the symbols/bits using an algebraic soft-decision technique in response to the modified probability. In some embodiments, the algebraic soft-decision technique may be the Koetter-Vardy technique. The Koetter-Vardy technique is generally described in the paper, "Algebraic soft-decision decoding of Reed-Solomon codes", IEEE Trans. Inform. Theory, vol. 49, no. 11, pp. 2809-2825, November 2003, which is hereby incorporated by reference in its entirety.

Figure 3:
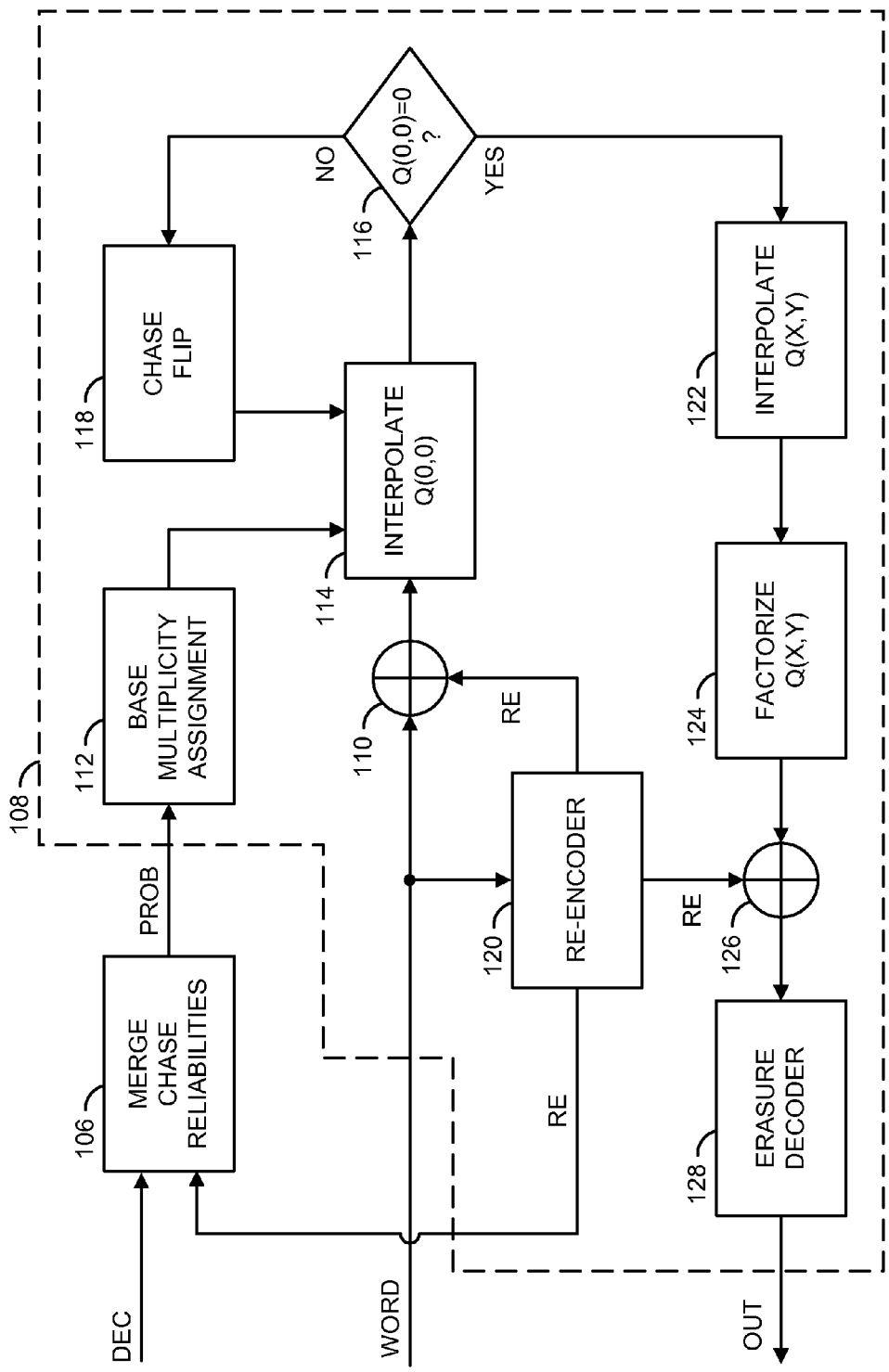
FIG. 3 is a detailed block diagram of an example implementation of an algebraic soft-decision decoder circuit.

Referring to FIG. 3, a detailed block diagram of an example implementation of the circuit 108 is shown. The circuit 108 generally comprises a block (or circuit) 110, a block (or circuit) 112, a block (or circuit) 114, a block (or circuit) 116, a block (or circuit) 118, a block (or circuit) 120, a block (or circuit) 122, a block (or circuit) 124, a block (or circuit) 126 and a block (or circuit) 128. The circuits 110 to 128 may represent modules and/or blocks that may be implemented as hardware, software, a combination of hardware and software, or other implementations.

The signal PROB may be received by the circuit 112. The signal WORD may be received by the circuits 110 and 120. The signal RE may be generated by the circuit 120 and transferred to the circuits 106, 110 and 126. The signal OUT may be generated by the circuit 128.

The circuit 110 may implement an adder circuit. The circuit 110 may be operational to sum the received word in the signal WORD with a re-encoded codeword received from the circuit 120 in the signal RE. The sum generally results in a word where the k most reliable positions are zeros.

The circuit 112 may implement a base multiplicity assignment circuit. The circuit 112 may be operational to compute a multiplicity matrix based on the merged reliability matrix received in the signal PROB. The multiplicity matrix may be presented to the circuit 114.

The circuit 114 may implement an interpolation circuit. The circuit 114 may be operational to interpolate the constant term of the bivariate polynomial Q(x,y) based on the multiplicity matrix computed by the circuit 112. The result may be transferred to the circuit 116.

The circuit 116 may implement a checking circuit. The circuit 116 may be operational to check if a constant term Q(0,0) is zero. If not, the corresponding bivariate polynomial Q(x,y) does not yield a valid codeword and thus is invalid. Therefore, Chase flipping may be performed in the circuit 118 in an attempt to correct the errors. If the constant term is zero, the bivariate polynomial Q(x,y) may be calculated in the circuit 122.

The circuit 118 may implement a Chase flipping circuit. The circuit 118 may be operational to flip a symbol based on the provided candidate flipping patterns. After the symbols has been flipped, the interpolation may be performed again in the circuit 114.

The circuit 120 may implement a re-encoder circuit. The circuit 120 is generally operational to erase the n–k least reliable positions in the codeword received in the signal WORD. The remaining k most reliable positions may be re-encoded into a valid codeword. The re-encoded codeword may be presented in the signal RE to the circuits 106, 110 and 126.

The circuit 122 may implement an interpolation circuit. The circuit 122 is generally operational to fully compute the bivariate polynomial Q(x,y). The computation may utilize the information that the constant term is zero.

The circuit 124 may implement a factorize circuit. The circuit 124 is generally operational to factorize the polynomial to retrieve the valid codeword whose n–k least reliable positions are to be determined. The factorized polynomial may be presented to the circuit 126.

The circuit 126 may implement an adder circuit. The circuit 126 is generally operational to add the re-encoded codeword to the factorized codeword. The sum generally forms a partially corrected candidate word over the received word.

The circuit 128 may implement and erasure decoder circuit. The circuit 128 is generally operational to apply an erasure-only decoding to correct any errors that may remain in the n–k positions of the word received from the circuit 126.

Figure 4:
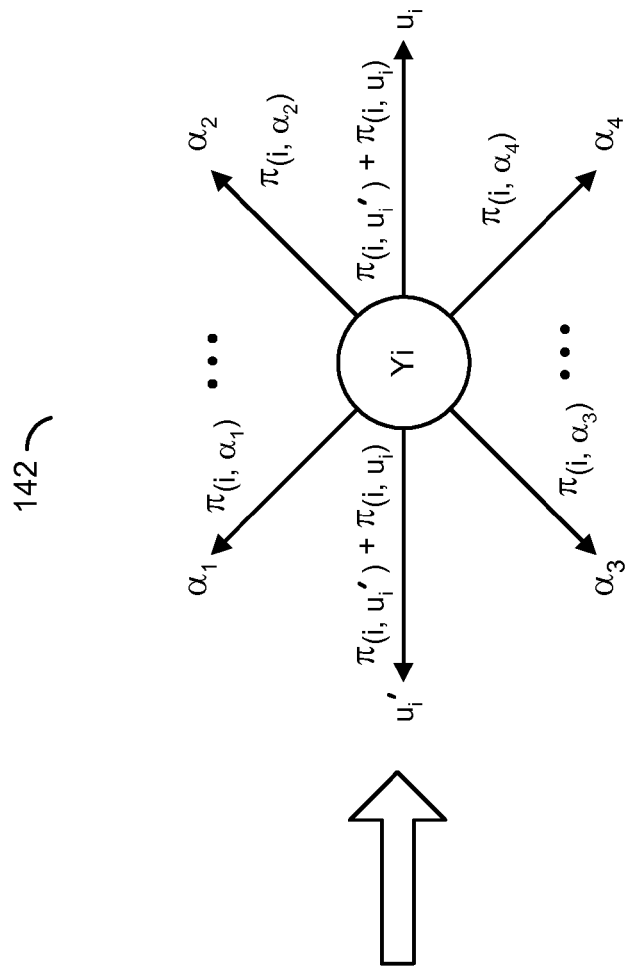
FIG. 4 is a diagram of an example merging of probability values.
Figure 4:
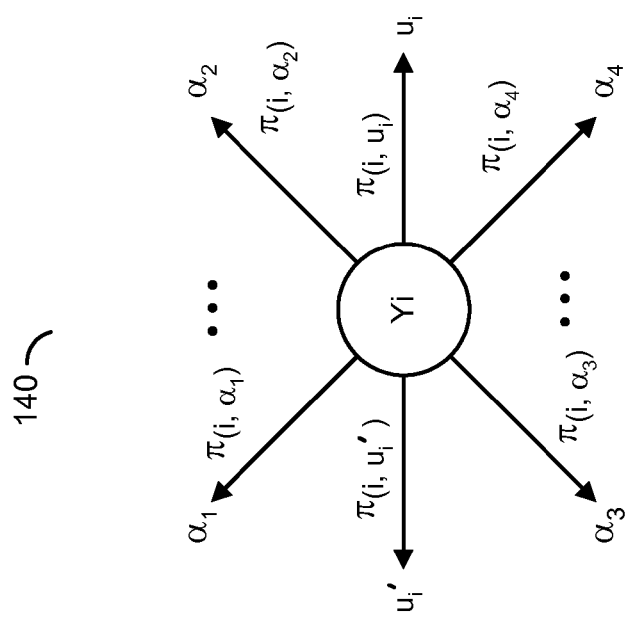

Referring to FIG. 4, a diagram of an example merging of probability values is shown. The merging operation may be performed by the circuit 106. Each position (e.g., Yi) of the codeword received through the channel may have corresponding hard-decision value (e.g., $u_i$), a secondary channel decision value (e.g., $u'_i$) and channel measurement information (e.g., $\alpha_{1\text{-}4}$), see reference arrow 140. The decision values and channel information may correspond to a posteriori probability values (e.g., $\pi_{(i,ui)}$ and $\pi_{(i,\alpha i)}$), respectively. Each secondary decision value may correspond to an a posteriori probability value (e.g., $\pi_{(i,u'i)}$). The circuit 106 may merge the two probability values for the hard-decision values and the secondary decision values (e.g., $\pi_{(i,u'i)}+\pi_{(i,ui)}$) in the unreliable positions, see reference arrow 142. Thus the hard-decision probabilities for position Yi may become a summed probability.

The real-number multiplicity assignment generally enables the Guruswami-Sudan technique to achieve q-ary Johnson bounds for q-ary BCH codes. The multiplicity assignment may be tightened to achieve any LECC value within the q-ary Johnson bound. Consider a situation where a fraction, n–n*, of positions may be pre-corrected. A tight multiplicity assignment may be used to achieve q-ary bound with respect to the effective code length n*, $$\frac{q-1}{q}n^*\left(1-\sqrt{1-\frac{q}{q-1}\frac{d}{n^*}}\right),$$

The LECC bounds may be devised under the BPSK modulation and the QAM modulation without knowledge of a noise distribution. The resulting bounds may be beyond the q-ary Johnson bound. In particular, by neglecting corruption beyond adjacent constellations in the QAM modulation, an improved LECC bound $$n\left(1-\frac{1}{3}\left(1+\sqrt{6\sqrt{1-d/n}-2}\right)\right)^2$$

may be obtained.

Chase decoding (which actually refers to Chase-II decoding) may provide suitable algebraic soft-decision decoding methods for high-rate short-to-medium-length codes. A decoding complexity associated with flipping an additional symbol may be O(n), in contrast to O(nd) by directly exploiting hard-decision decoding. Without applying Chase flipping, secondary channel decisions exhibit small probabilities, thus are generally to assign small multiplicities. Chase exhaustive flipping essentially merges two most reliable channel decisions into a unified estimation with almost twice higher reliability, thus the multiplicities are literally doubled for the two most reliable channel decisions which involve Chase flipping.

Let Fq be a finite field and Fq[X] be a ring of polynomials defined over Fq. A given message f(x) with degree up to k–1, $f(x)=f_0+f_1x+f_2x^2+\ldots+f_{k-1}x^{k-1}$, may be encoded into a (possibly shortened) Reed-Solomon codeword of length n by formula 1 as follows:

$$c=[f(1),f(\alpha),f(\alpha^2),\ldots,f(\alpha^{n-1})], \quad (1)$$

where $\alpha$ is a primitive element of Fq. Since f(x) may have up to k–1 zeros, the resulting codeword may have at least n–(k–1) nonzero positions (e.g., the minimum code weight may be d=n–k+1, a property known as maximal distance separable.)

For a received channel word y=[y1, y2, . . . , yn], a (1,n–d)-weighted bivariate polynomial Q(x,y) may be defined which passes through all n points, (x1, y1), (x2, y2), . . . , (xn, yn), each with a multiplicity m. A bivariate polynomial may be a polynomial with two variables. Passing through a point (x,y) by m times generally results in m(m+1)/2 linear constraints. If the number of coefficients of Q(x,y) is greater than the total number of linear constraints, nm(m+1)/2, there may exist nonzero solutions of Q(x,y). Let d denote a minimal (1,n–d)-weighted degree of Q(x,y), a corresponding number of degrees of freedom is generally determined by formula 2 as follows:

$$N_{free}=\left(1+\left\lfloor\frac{\delta}{n-d}\right\rfloor\right)\left(\delta+1-\frac{n-d}{2}\left\lfloor\frac{\delta}{n-d}\right\rfloor\right) \quad (2)$$

A number of degrees of freedom may be satisfied by formula 3 as follows:

$$\begin{aligned}N_{free}&=\left(\delta+1-\frac{n-d}{2}\left\lfloor\frac{\delta}{n-d}\right\rfloor\right)\left(\left\lfloor\frac{\delta}{n-d}\right\rfloor+1\right)\\&=\left((n-t)m-\frac{n-d}{2}\left\lfloor\frac{(n-t)m-1}{n-d}\right\rfloor\right)\left(\left\lfloor\frac{(n-t)m-1}{n-d}\right\rfloor+1\right)\\&=-\frac{n-d}{2}\left(\left\lfloor\frac{(n-t)m-1}{n-d}\right\rfloor-\frac{(n-t)m}{n-d}+\frac{1}{2}\right)^2+\\&\quad\frac{((n-t)m+(n-d)/2)^2}{2(n-d)}\\&=\geq\frac{n-d}{8}+\frac{((n-t)m+(n-d)/2)^2}{2(n-d)}\end{aligned} \quad (3)$$

where the weighted degree $\delta$ may be maximized by $\delta=m(n-t)-1$. An enforcement for a solvable linear system generally indicates condition 4 as follows:

$$\frac{n-d}{8}+\frac{((n-t)m+(n-d)/2)^2}{2(n-d)}>\frac{1}{2}nm(m+1) \quad (4)$$

Solving with respect to t, generally results in formula 5 as follows:

$$t<n-\sqrt{n(n-d)}, \quad (5)$$

which may achieve the general Johnson bound. The lower bound per formula 3 may be tight in terms of LECC t, while affecting the value of multiplicity m to achieve a particular LECC t. In the sequel, formula 2 may be treated as an equality.

For any given t satisfying formula 5, the multiplicity m may be selected which dictates the technique complexity per formula 6 as follows:

$$m=\left\lfloor\frac{t(n-d)}{(n-t)^2-n(n-d)}+1\right\rfloor \quad (6)$$

Figure 5:
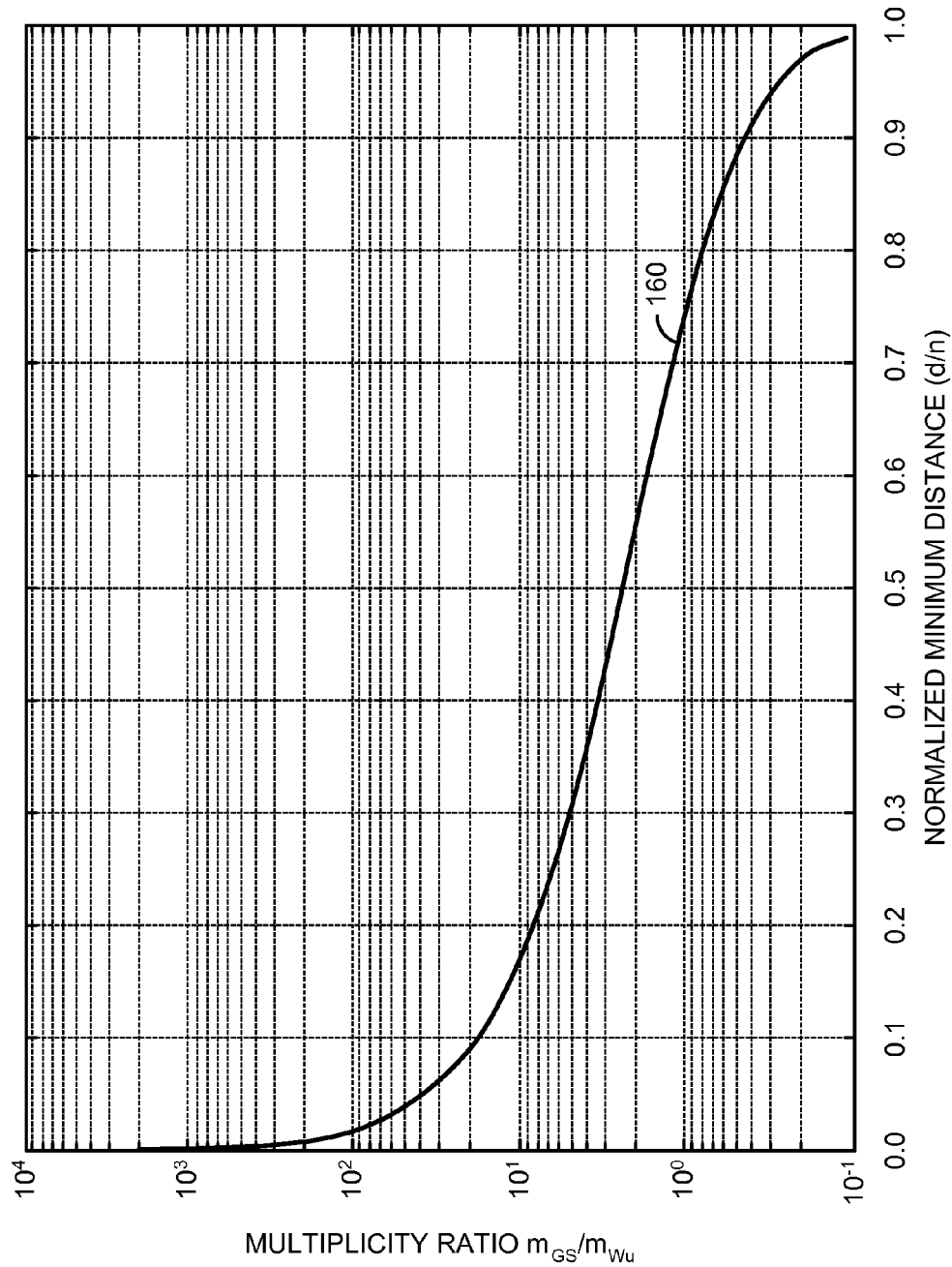
FIG. 5 is a graph of a multiplicity ratio of the Guruswami-Sudan technique over a Wu technique.

Referring to FIG. 5, a graph of a multiplicity ratio 160 of the Guruswami-Sudan technique over the Wu technique is shown. The graph generally indicates that the Guruswami-Sudan technique may be more efficient when a code rate is below roughly 0.25. The multiplicity ratio of the Guruswami-Sudan technique over the Wu technique for decoding Reed-Solomon may code up to the Johnson bound.

A Koetter-Vardy probability transformation may be described as follows. A memoryless channel may be defined as a collection of a finite field alphabet Fq, an output alphabet D, and q functions per formula 7 as follows:

$$f(y|x): D \text{ maps to } R, \text{for all } x \in Fq \quad (7)$$

Upon receiving a channel word y=[$y_1, y_2, \ldots, y_n$], a hard-decision vector u=[$u_1, u_2, \ldots, u_n$] may be determined per formula 8 as follows:

$$u_i=\arg\max_{\gamma\in Fq}Pr(X=\gamma\mid Y=y_i)=\arg\max_{\gamma\in Fq}\frac{f(y_i\mid\gamma)}{\sum_{x\in Fq}f(y_i\mid x)} \quad (8)$$

where the second equality generally follows from an assumption that X is uniform. A probability that a symbol X=x is transmitted given that y is observed may be computed by formula 9 as follows:

$$\begin{aligned}Pr(X=x\mid Y=y)&=\frac{f(y\mid x)Pr(X=x)}{\sum_{\gamma\in F_q}f(y\mid\gamma)Pr(X=x)}\\&=\frac{f(y\mid x)}{\sum_{\gamma\in F_q}f(y\mid\gamma)}\ldots\end{aligned} \quad (9)$$

Given the received word y=[$y_1, y_2, \ldots, y_n$], the a posteriori probability matrix $\Pi$ may be computed by formula 10 as follows:

$$\pi_{i,j}=Pr(X=j|y=y_i), \quad (10)$$

for i=1, 2, . . . , n, and j=0, 1, 2, . . . , q–1. A cost associated with a multiplicity matrix $M_{n\times q}$ may be given by formula 11 as follows:

$$C=\sum_{i=1}^{n}\sum_{j=1}^{q}m_{i,j}(m_{i,j}+1)/2 \quad (11)$$

A random vector $M_M=[M_1, M_2, \ldots, M_n]$ associated with a multiplicity matrix M may be defined by formula 12 as follows:

$$Pr(M_i=m_{i,j})=Pr(X=j|Y=y_i)=\pi_{i,j}, j=1,2,\ldots,q, \quad (12)$$

for $i=1, 2, \ldots, n$. An expected score associated with the random vector $M_M$ may be defined by formula 13 as follows:

$$E\{M_M\}E\left\{\sum_{i=1}^{n} M_i\right\} = \sum_{i=1}^{n}\sum_{j=1}^{q} m_{i,j}\pi_{i,j} \qquad (13)$$

Given the reliability matrix $\Pi$, the multiplicity matrix M may be computed to maximize an expected score subject to a given maximum cost, mathematically, per formula 14 as follows:

$$M(\prod, C) = \arg\max_{M \in M'(C)} = E\{M_M\} \qquad (14)$$

where $$M'(C) = \left\{M \in Z^{n \times q} : \frac{1}{2}\sum_{i=1}^{n}\sum_{j=1}^{q} m_{i,j}(m_{i,j}+1) \leq C\right\}.$$

When the cost goes to infinity, the normalized multiplicity generally converges to the normalized reliability matrix. Furthermore, for any scalar $\mu$, a cost C associated with the maximum expected score $M(\Pi,C)$ generally exists per formula 15 as follows:

$$M(\Pi,C) = \lfloor \mu\Pi \rfloor \qquad (15)$$

The expected score $M(\Pi,C)$ may yield a mean number of degrees of freedom per formula 16 as follows:

$$E\{N_{free}\} \geq \frac{n-d}{8} + \frac{(E\{M_{M(\Pi,C)}\} + (n-d)/2)^2}{2(n-d)}. \qquad (16)$$

The Guruswami-Sudan technique generally achieves the general Johnson bound $n(1-\sqrt{1-d/n})$. The Guruswami-Sudan technique may also achieve the q-ary Johnson bound, $$\frac{q-1}{q}n\left(1 - \sqrt{1 - \frac{q}{q-1}\frac{d}{n}}\right)$$

The bound may be achieved by assigning multiplicities pertinently across the entire field Fq, whereas the original Guruswami-Sudan technique may assign only a nontrivial multiplicity to the field element of a channel hard-decision. The Guruswami-Sudan technique may effectively achieve the q-ary Johnson bound with respect to a shortened code length by eliminating pre-corrected positions. For example, $$\frac{q-1}{q}n^*\left(1 - \sqrt{1 - \frac{q}{q-1}\frac{d}{n^*}}\right),$$

where n* generally denotes the shortened code length.

Let $[c_1, c_2, \ldots, c_n]$ be a transmitted Reed-Solomon codeword and $[u_1, u_2, \ldots, u_n]$ be a channel hard-decision vector, where $u_i \in Fq$. The Guruswami-Sudan technique may effectively achieve the q-ary Johnson bound per formula 17 as follows:

$$t < n\frac{q-1}{q}\left(1 - \sqrt{1 - \frac{q}{q-1}\frac{d}{n}}\right). \qquad (17)$$

Consider a case involving t errors out of n symbols. If no soft reliability information is given for each symbol, each symbol may be treated similarly with an error probability t/n. More specifically, the probability may be defined by formula 18 as follows:

$$Pr(c_i = x) = \begin{cases} 1 - \frac{t}{n} & x = u_i \\ \frac{t}{(q-1)n} & x \neq u_i \quad x \in F_q \\ 0 & \text{otherwise} \end{cases} \qquad (18)$$

Correspondingly, multiplicities $m_{i,j}$, $i=1, 2, \ldots, n$, $j=1, 2, \ldots, q$, may be assigned by formula 19 as follows:

$$m_{i,j} = \begin{cases} m_1 & \text{if } j = u_i \\ m_2 & \text{if } j \neq u_i \end{cases} \qquad (19)$$

The multiplicities $m_1$ and $m_2$ may be treated as real numbers and consider to maximize the mean score, subject to a fixed cost. Since each position generally has a similar multiplicity assignment, an adjustment of the mean score with respect to a single position, for conciseness may be expressed by formula 20 as follows:

$$\max E\{M\} = \left(1 - \frac{t}{n}\right)m_1 + \frac{t}{n}m_2 \qquad (20)$$

$$s.t. \frac{m_1(m_1+1)}{2} + (q-1)\frac{m_2(m_2+1)}{2} = C$$

The formula 20 may be re-written as formula 21 as follows:

$$\left(m_1 + \frac{1}{2}\right)^2 + (q-1)\left(m_2 + \frac{1}{2}\right)^2 = 2C + \frac{q}{4} \qquad (21)$$

The notation may be simplified per formulas 22-24 as follows:

$$m'_1 = m_1 + 1/2 \qquad (22)$$

$$m'_2 = m_2 + 1/2 \qquad (23)$$

$$C' = 2C + q/4 \qquad (24)$$

Therefore, formula 20 may be re-formulate as formula 25 as follows:

$$\max E\{M\} = \left(1 - \frac{t}{n}\right)m'_1 + \frac{t}{n}m'_2 - \frac{1}{2} \qquad (25)$$

such that ${m'_1}^2 + (q-1){m'_2}^2 = C$.

The formula 25 generally yields formula 26 as follows:

$$m'_1 = \sqrt{C' - (q-1){m'_2}^2} \qquad (26)$$

Thus, formula 27 may be obtained as follows:

$$E\{M\} = \left(1 - \frac{t}{n}\right)\sqrt{C' - (q-1)m_2'^2} + \frac{t}{n}m_2' - \frac{1}{2} \quad (27)$$

Taking a derivative of formula 20 with respect to m'$_2$ and setting to zero, formula 28 may be obtained as follows:

$$0 = \frac{t}{n} - \left(1 - \frac{t}{n}\right) \cdot \frac{(q-1)m_2'}{\sqrt{C' - (q-1)m_2'^2}} \quad (28)$$

Solving formula 28 generally results in formula 29 as follows:

$$m_2' = \frac{\frac{t}{n}\sqrt{C'}}{\sqrt{\left(1 - \frac{t}{n}\right)^2 (q-1)^2 + \frac{t^2}{n^2}(q-1)}} \quad (29)$$

Substituting formula 29 into formula 20, the following maximum expected symbol score may be given by formula 30 as follows:

$$E\{M\} = \sqrt{C'\left(\frac{t^2}{(q-1)n^2} + \left(1 - \frac{t}{n}\right)^2\right)} - \frac{1}{2} \quad (30)$$

$$= \sqrt{\left(2C + \frac{q}{4}\right)\left(\frac{t^2}{(q-1)n^2} + \left(1 - \frac{t}{n}\right)^2\right)} - \frac{1}{2}$$

which is achieved by setting multiplicities $m_1$ and $m_2$ per formulas 31 and 32 as follows:

$$m_1 = \frac{\left(1 - \frac{t}{n}\right)(q-1)\sqrt{2C + \frac{q}{4}}}{\sqrt{\left(1 - \frac{t}{n}\right)^2 (q-1)^2 + \frac{t^2}{n^2}(q-1)}} - \frac{1}{2} \quad (31)$$

$$m_2 = \frac{\frac{t}{n}\sqrt{2C + \frac{q}{4}}}{\sqrt{\left(1 - \frac{t}{n}\right)^2 (q-1)^2 + \frac{t^2}{n^2}(q-1)}} - \frac{1}{2} \quad (32)$$

Given that t errors have occurred, the resulting score may be the expected score, as is verified by formula 33 as follows:

$$nE\{M\} = \sqrt{\left(2C + \frac{q}{4}\right)\left(\frac{t^2}{(q-1)n^2} + \left(1 - \frac{t}{n}\right)^2\right)} - \frac{n}{2} \quad (33)$$

$$= \frac{n\left(\frac{t^2}{(q-1)n^2} + \left(1 - \frac{t}{n}\right)^2\right)\sqrt{2C + \frac{q}{4}}}{\sqrt{\left(1 - \frac{t}{n}\right)^2 (q-1)^2 + \frac{t^2}{n^2}(q-1)}} - \frac{n}{2}$$

-continued $$= \frac{(n-t)\left(1 - \frac{t}{n}\right)(q-1)\sqrt{2C + \frac{q}{4}}}{\sqrt{\left(1 - \frac{t}{n}\right)^2 (q-1)^2 + \frac{t^2}{n^2}(q-1)}} - \frac{n-t}{2} +$$

$$\frac{t\frac{t}{n}\sqrt{2C + \frac{q}{4}}}{\sqrt{\left(1 - \frac{t}{n}\right)^2 (q-1)^2 + \frac{t^2}{n^2}(q-1)}} - \frac{t}{2}$$

$$= (n-t)m_1 + tm_2$$

The expected number of degrees of freedom with respect to the given expected score, $nE\{M\}$, may be maximized. Therefore, a weighted (1,n–d)-degree of Q(x,y) may be maximized by formula 34 as follows:

$$\deg_{1,n-d}(Q(x,y)) = nE\{M\} - 1 \quad (34)$$

with a degree of y, denoted by Ly, may be determined by formula 35 as follows:

$$L_y = \left\lfloor \frac{\deg_{1,n-d}(Q(x,y))}{n-d} \right\rfloor = \left\lfloor \left(\frac{nE\{M\} - 1}{n-d}\right) \right\rfloor \quad (35)$$

Consequently, the expected number of degrees of freedom is generally maximized per formula 36 as follows:

$$E\{N_{free}\} = \sum_{i=0}^{L_y} 1 + \deg_{1,n-d}(Q(x,y)) - i(n-d)L_y$$

$$= 1/2(2\deg_{1,n-d}(Q(x,y)) + 2 - (n-d)L_y)(L_y + 1)$$

$$= 1/2(2nE\{M\} - (n-d)L_y)(L_y + 1)$$

$$= -\frac{n-d}{2}\left(L_y - \frac{nE\{M\}}{n-d} + \frac{1}{2}\right)^2 +$$

$$\frac{(nE\{M\} + (n-d)/2)^2}{2(n-d)}$$

$$\geq -\frac{n-d}{8} + \frac{(nE\{M\} + (n-d)/2)^2}{2(n-d)}$$

$$= \frac{\left(n\left(\sqrt{\left(2C + \frac{q}{4}\right)\left(\frac{t^2}{(q-1)n^2} + \left(1 - \frac{t}{n}\right)^2\right)} - \frac{1}{2}\right) + (n-d)/2\right)^2}{2(n-d)} -$$

$$\frac{n-d}{8}$$

The linear system may be solvable in a mean sense if the expected number of degrees of freedom is greater than the number of linear constraints, for example, if formula 37 is true as follows:

$$\frac{\left(n\left(\sqrt{\left(2C + \frac{q}{4}\right)\left(\frac{t^2}{(q-1)n^2} + \left(1 - \frac{t}{n}\right)^2\right)} - \frac{1}{2}\right) + (n-d)/2\right)^2}{2(n-d)} - \frac{n-d}{8} \geq \quad (37)$$

$$nC$$

Dividing both sides by C and letting C go to infinity, the formula 37 is generally reduced to formula 38 as follows:

$$n\sqrt{2\left(\frac{t^2}{(q-1)n^2}+\left(1-\frac{t}{n}\right)^2\right)} > \sqrt{2(n-d)n} \quad (38)$$

Solving formula 38 generally results in formula 39 as follows:

$$t < \frac{q-1}{q}n\left(1-\sqrt{1-\frac{q}{q-1}\frac{d}{n}}\right) \quad (39)$$

which generally achieves the q-ary Johnson bound.

Given that the LECC t satisfies formula 39, a minimum cost C which governs multiplicities $m_1$ and $m_2$ as defined in formula 31 and 32, respectively may be determined. Define $$a = \sqrt{C+\frac{q}{8}},$$

the formula in formula 37 may reduced per formula 40 as follows:

$$\left(a\sqrt{2\frac{t^2}{q-1}+2(n-t)^2}-\frac{d}{2}\right)^2 > 2(n-d)n\left(a^2-\frac{q}{8}\right)+\frac{(n-d)^2}{4} \quad (40)$$

which yields formula 41 as follows:

$$a^2\left(2\frac{t^2}{q-1}+2(t^2+nd-2nt)\right) - ad\sqrt{2\frac{t^2}{q-1}+2(n-t)^2} + \frac{n^2(q-1)}{4} - \frac{nd(q-2)}{4} > 0 \quad (41)$$

Solving, a tight lower bound may be obtained per formula 42 as follows:

$$a > \frac{d\sqrt{\frac{t^2}{q-1}+(n-t)^2} + \sqrt{d^2\left(\frac{t^2}{q-1}+(n-t)^2\right) - (n^2(q-1)-nd(q-2))\left(\frac{t^2}{q-1}+t^2+nd-2nt\right)}}{2\sqrt{2}\left(\frac{t^2}{q-1}+t^2+nd-2nt\right)} \quad (42)$$

Therefore, set C may be the tight lower bound given in formula 43 as follows:

$$C > \left(\frac{d\sqrt{\frac{t^2}{q-1}+(n-t)^2} + \sqrt{d^2\left(\frac{t^2}{q-1}+(n-t)^2\right) - (n^2(q-1)-nd(q-2))\left(\frac{t^2}{q-1}+t^2+nd-2nt\right)}}{2\sqrt{2}\left(\frac{t^2}{q-1}+t^2+nd-2nt\right)}\right)^2 - \frac{q}{8} \quad (43)$$

Consider a case where a channel hard-decision vector u has $$t < \frac{q-1}{q}n\left(1-\sqrt{1-\frac{q}{q-1}\frac{d}{n}}\right)$$

errors from a transmitted codeword c. Let the multiplicity matrix M be assigned as in formula 19, where $m_1$, $m_2$ may be determined by formulas 31 and 32, respectively, in conjunction with formula 42. Therefore, the errors may be guaranteed to be list corrected by the Guruswami-Sudan technique with the proposed multiplicity matrix M. Let the LECC be given by formula 44 as follows:

$$t = (1-\varepsilon)\frac{q-1}{q}n\left(1-\sqrt{1-\frac{q}{q-1}\frac{d}{n}}\right) \quad (44)$$

Thus formula 44 generally sets two types of multiplicities per formulas 45 and 46 as follows:

$$m_1 = \frac{1-(1-\varepsilon)\frac{q-1}{q}\left(1-\sqrt{1-\frac{q}{q-1}\frac{d}{n}}\right)}{2\varepsilon\frac{q-1}{q}\left(1-\sqrt{1-\frac{q}{q-1}\frac{d}{n}}\right)\sqrt{1-\frac{q}{q-1}\frac{d}{n}}} \quad (45)$$

$$m_2 = \frac{(1-\varepsilon)}{2(q-1)\varepsilon\sqrt{1-\frac{q}{q-1}\frac{d}{n}}} \quad (46)$$

Figure 6:
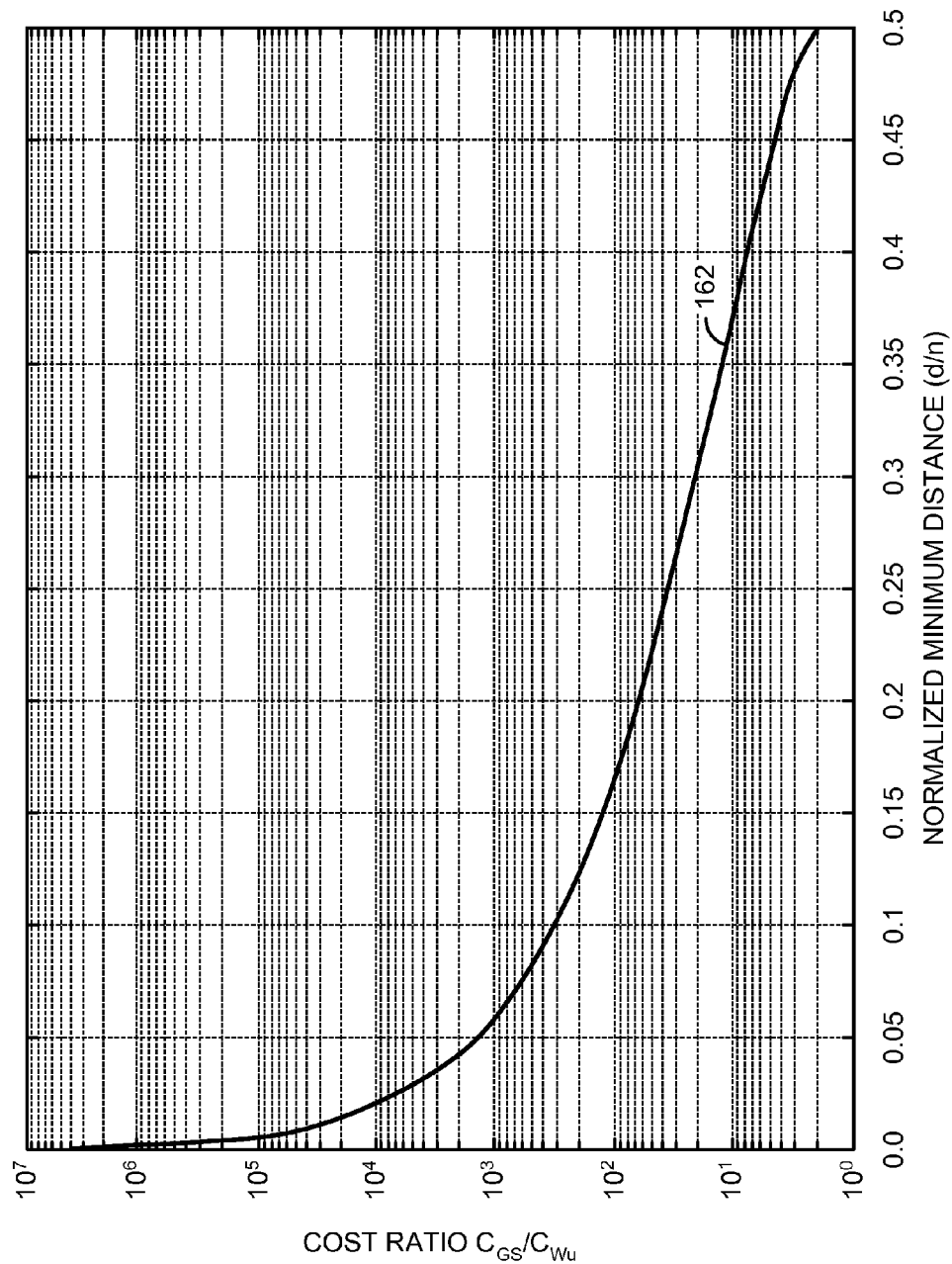
FIG. 6 is a graph of a cost ratio of the Guruswami-Sudan technique over the Wu technique for decoding binary BCH/Goppa codes up to the binary Johnson bound.

Referring to FIG. 6, a graph of a cost ratio 162 of the Guruswami-Sudan technique over the Wu technique for decoding binary BCH/Goppa codes up to the binary Johnson bound is shown. The curve 162 generally indicates that the Guruswami-Sudan technique is generally less efficient as the cost may be orders of magnitude than the Wu technique.

Consider a situation when some positions may be pre-corrected. Let J be the set of pre-corrected positions. Let |J|=n−n*, where n* stands for the shortened effective code length. Let t be the number of errors occurring over n* positions. Then, a hard-decision associated with one of n* positions has an error probability of tn*. The multiplicities $m_{i,j}$, i=1, 2, ..., n, j=1, 2, ..., q, are generally per formula 47 as follows:

$$m_{i,j} = \begin{cases} m_1 & \text{if } j = u_i, \ i \notin J \\ m_2 & \text{if } j \neq u_i, \ i \notin J \\ m_3 & \text{if } j - u_i, \ i \in J \\ 0 & \text{otherwise} \end{cases} = \quad (47)$$

The expected score may be maximized subject to the given overall cost, per formula 48 as follows:

$$\max E\{M\} = (n^* - t)m_1 + tm_2 + (n - n^*)m_3 \quad (48)$$

such that $$n^* \frac{m_1(m_1+1)}{2} + n^*(q-1)\frac{m_2(m_2+1)}{2} + (n-n^*)\frac{m_3(m_3+1)}{2} = C$$

A modified multiplicity $m_1'$ may be defined by formula 49 as follows:

$$m_i' = m_i + \frac{1}{2}, \ i = 1, 2, 3 \quad (49)$$

A modified cost C' may be defined by formula 50 as follows:

$$C' = 2C + \frac{n^*q + n - n^*}{4}. \quad (50)$$

Therefore, the formula 48 may be re-formulate as formula 51 as follows:

$$\max E\{M\} = (n^* - t)m_1' + tm_2' + (n - n^*)m_3' - \frac{n}{2} \quad (51)$$

such that $n^* m_1'^2 + n^*(q-1)m_2'^2 + (n-n^*)m_3'^2 = C'$.
By observing formula 52 as follows:

$$(n^* - t)m'1 + tm'2 + (n-n^*)m'3 = \quad (52)$$

$$\sum_{i=1}^{n^*} \frac{n^*-t}{n^*}m_1' + \sum_{i=1}^{n^*(q-1)} \frac{t}{(q-1)n^*}m_2' + \sum_{i=1}^{n^*n} m_3' \leq$$

$$\left(\sum_{i=1}^{n^*} \frac{(n^*-t)^2}{n^{*2}} + \sum_{i=1}^{n^*(q-1)} \frac{t^2}{(q-1)^2 n^{*2}} + \sum_{i=1}^{n-n^*} 1\right)^{\frac{1}{2}} \cdot$$

$$\left(\sum_{i=1}^{n^*} m_1'^2 + \sum_{i=1}^{n^*(q-1)} m_2'^2 + \sum_{i=1}^{n-n^*} m_3'^2\right)^{\frac{1}{2}} =$$

$$\left(\frac{(n^*-t)^2}{n^*} + \frac{t^2}{(q-1)n^*} + (n-n^*)\right)^{\frac{1}{2}} \cdot C'^{\frac{1}{2}}$$

where "=" may be achieved if and only if $$\frac{m_1'}{\frac{n^*-t}{n^*}} = \frac{m_2'}{\frac{t}{(q-1)n^*}} = m_3'.$$

To simplify notation, a parameter $\Delta t$ may be defined by formula 53 as follows:

$$\Delta_t = \frac{(n^*-t)^2}{n^*} + \frac{t^2}{(q-1)n^*} + (n-n^*) \quad (53)$$

Therefore, E{M} may be maximized per formula 54 as follows:

$$E\{M\} = \Delta_t^{\frac{1}{2}} C'^{\frac{1}{2}} - \frac{n}{2} \quad (54)$$

by setting the multiplicities per formulas 55-57 as follows:

$$m_3 = m_3' - \frac{1}{2} = \Delta_t^{-\frac{1}{2}} C'^{\frac{1}{2}} - \frac{1}{2} \quad (55)$$

$$m_1 = \frac{n^*-t}{n^*}m_3' - \frac{1}{2} \quad (56)$$

$$m_2 = \frac{t}{(q-1)n^*}m_3' - \frac{1}{2} \quad (57)$$

Following formula 36, the expected number of degrees of freedom may be maximized to a lower bound per formula 58 as follows:

$$E\{N_{free}\} = \frac{n-d}{8} + \frac{(E\{M\} + (n-d)/2)^2}{2(n-d)} \quad (58)$$

$$= \frac{n-d}{8} + \frac{\left(\Delta_t^{\frac{1}{2}} C'^{\frac{1}{2}} - \frac{d}{2}\right)^2}{2(n-d)}$$

The enforcement that the number of degrees of freedom is greater than the cost may become formula 59 as follows:

$$\frac{\left(\Delta_t^{\frac{1}{2}} C'^{\frac{1}{2}} - \frac{d}{2}\right)^2}{2(n-d)} - \frac{n-d}{8} > C \quad (59)$$

Dividing both sides of formula 59 by C and letting C go to infinity yields formula 60 as follows:

$$\Delta_t = \frac{(n^*-t)^2}{n^*} + \frac{t^2}{(q-1)n^*} + (n-n^*) > (n-d) \quad (60)$$

Solving formula 60 may result in formula 61 as follows:

$$t < \frac{q-1}{q}n^*\left(1 - \sqrt{1 - \frac{q}{q-1}\frac{d}{n^*}}\right) \quad (61)$$

which generally matches the q-ary Johnson bound with respect to effective code length n*.

A minimum cost C to enforce an LECC t satisfying formula 61 may be determined as follows. By defining $$a = \sqrt{C + \frac{n^* q + n - n^*}{8}},$$

the formula 59 may reduced to formula 62 as follows:

$$a^2 2\left(\frac{(n^* - t)^2}{n^*} + \frac{t^2}{(q-1)n^*} + n^* - d\right) - \qquad (62)$$
$$a\sqrt{2}\, d\Delta_t^{\frac{1}{2}} + \frac{n-d}{4} n^*(q-1) + \frac{nd}{4} > 0$$

A tight lower bound may thus exist per formula 63 as follows:

$$a > \frac{d\sqrt{\Delta_t} + \sqrt{d^2 \Delta_t - (nd + (n-d)n^*(q-1))\left(\frac{(n^* - t)^2}{n^*} + \frac{t^2}{(q-1)n^*} + n^* - d\right)}}{\left(2\sqrt{2}\left(\frac{(n^* -)t^2}{n^*}, n^*\right) + \frac{t^2}{(q-1)n^*} + n^* - d\right)} \qquad (63)$$

Therefore, in order to achieve an LECC t satisfying formula 63, the cost C may be set per formula 64 as follows:

$$C > -\frac{n^* q + n - n^*}{8} + \left(\frac{d\sqrt{\Delta_t} + \sqrt{d^2 \Delta_t - (nd + (n-d)n^*(q-))\left(\frac{(n^* - t)^2}{n^*} + \frac{t^2}{(q-1)n^*} + n^* - d\right)}}{2\sqrt{2}\left(\frac{(n^* -)t^2}{n^*}, n^*\right) + \frac{t^2}{(q-1)n^*} + n^* - d}\right)^2 \qquad (64)$$

After C is determined, the multiplicities $m_1$, $m_2$, and $m_3$ may be computed following formulas 55, 56 and 57, respectively.

Figure 7:
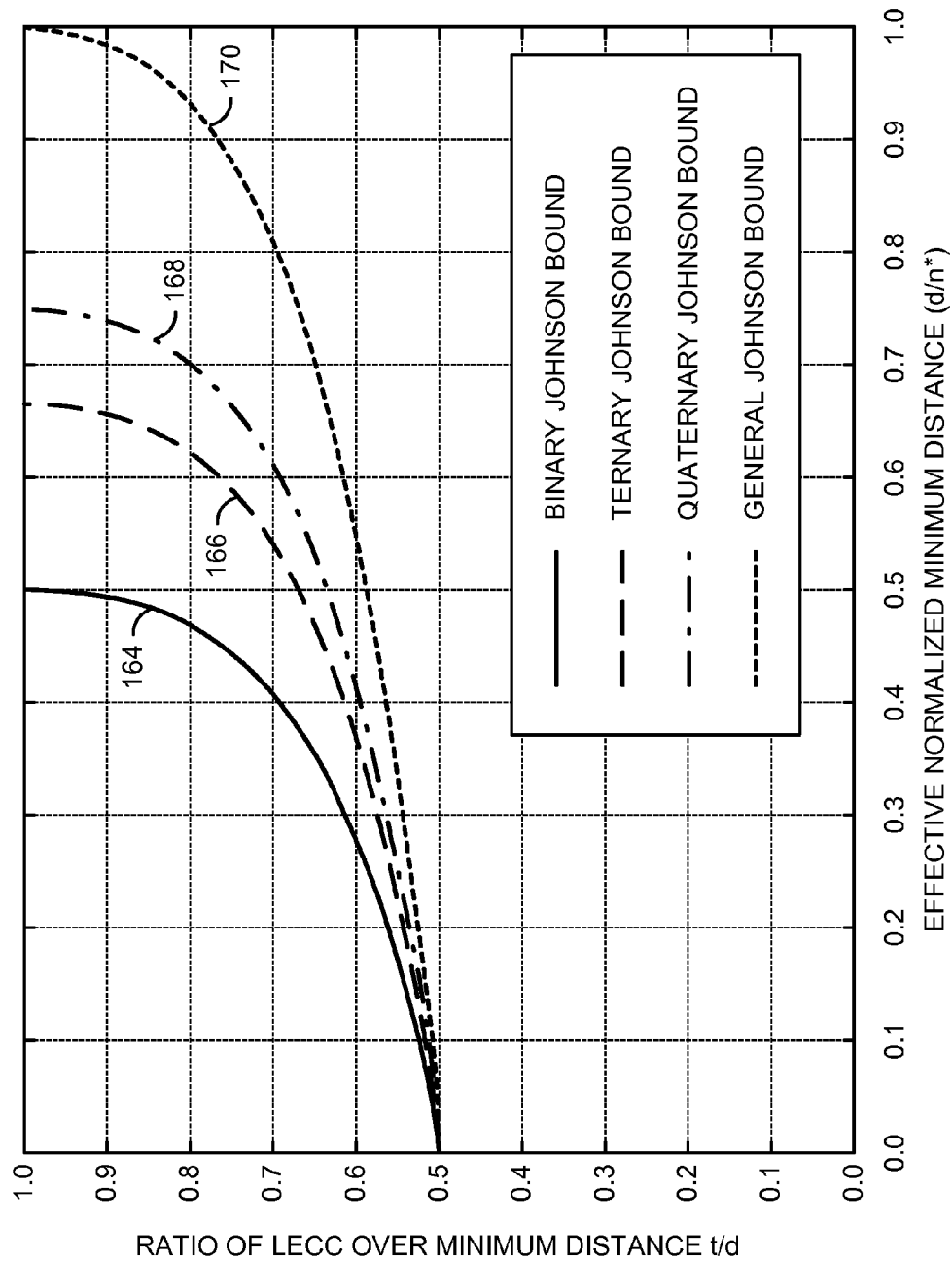
FIG. 7 is a graph of ratios of q-ary list decoding capabilities to minimum distances as a function of ratio of minimum distances to the effective code length.

Referring to FIG. 7 a graph of ratios of q-ary list decoding capabilities to minimum distances as a function of ratio of minimum distances to the effective code length is shown. Consider a case where a channel hard-decision vector u may be partially pre-corrected such that the positions in a set $J(|J|=n-n^*)$ may be pre-corrected. Furthermore, consider that u may have $$t < \frac{q-1}{q} n^* \left(1 - \sqrt{1 - \frac{q}{q-1}\frac{d}{n^*}}\right)$$

errors from the n* uncertain positions. The multiplicity matrix M may be assigned as in formula 47, where the multiplicities $m_1$, $m_2$ and $m_3$, are generally determined by formula 55, 56 and 57, respectively, in conjunction with formula 64. Thus, the errors may be list corrected by the Guruswami-Sudan technique with the proposed multiplicity matrix. As such, the effective code length n* may be reduced toward a nontrivial q-ary minimum code length $$\frac{q}{q-1} d$$

and the LECC t generally converges to d, as illustrated in FIG. 7. The curve 164 may illustrate a binary Johnson bound. The curve 166 generally illustrates a ternary Johnson bound. The curve 168 may represent a quaternary Johnson bound. Furthermore, the curve 170 may illustrate a general Johnson bound.

The LECC may be enhanced by incorporating various modulation methods. Consider a binary phase-shift keying (e.g., BPSK) modulation of a Reed-Solomon code over $F_2 w$. Let $[c_1, c_2, \ldots, c_n]$ be a transmitted Reed-Solomon codeword and $[u_1, u_2, \ldots, u_n]$ be a channel hard-decision vector, where $u_i \in F_2 w$. Consider a situation with t errors out of n symbols. If no soft reliability data is given for each symbol, each symbol may be treated equally with an error probability t/n. Consequently, the bit error probability, $p_b$, generally satisfies formula 65 as follows:

$$1 - \frac{t}{n} = (1 - p_b) \Leftrightarrow p_b = 1 - \left(1 - \frac{t}{n}\right)^{\frac{1}{w}} \qquad (65)$$

and symbol transition probabilities may be given by formula 66 as follows:

$$Pr(c_i = x) = p_b^l (1 - p_b)^{l/w} \qquad (66)$$

where $l = w(c_i \oplus x)$ and $w(\gamma)$ generally denotes the Hamming weight of the binary representation of $\gamma \in F_2 w$. Correspondingly, the multiplicities $m_{i,j}$, $i=1, 2, \ldots, n$, $j=1, 2, \ldots, q$, may be assigned by formula 67 as follows:

$$m_{i,j} = m_l, \text{if } l = w(j \oplus u_i) \qquad (67)$$

The multiplicities $m_l$, $l=0, 1, 2, \ldots, w$, may be treated as real numbers and considered to maximize the mean score, subject to a fixed cost. Since each position has a similar multiplicity assignment, an improvement of the mean score with respect to a single position, for conciseness, may be given by formula 68 as follows:

$$\max E\{M\} = \sum_{l=0}^{w} \binom{w}{l} p_b^l (1 - p_b)^{w-l} m_l \qquad (68)$$

such that $\sum_{l=0}^{w} \binom{w}{l} \frac{m_l(m_l + 1)}{2} = C$

The modified multiplicity $m'_l$ may be defined by formula 69 as follows:

$$m'_l = ml + \tfrac{1}{2}, l=0,1,2,\ldots,w \qquad (69)$$

Formula 69 may be re-written into formula 70 as follows;

$$\max E\{M\} = \sum_{l=0}^{w} \binom{w}{l} p_b^l (1-p_b)^{w-l} m'_l - \frac{1}{2}. \qquad (70)$$

$$\text{such that } \sum_{l=0}^{w} \binom{w}{l} m'^2_l = 2C + 2^{w-2}.$$

Solving generally produces formula 71 as follows:

$$E\{M\} \le -\frac{1}{2} + \left(\sum_{l=0}^{w} \binom{w}{l} p_b^{2l}(1-p_b)^{2(w-l)}\right)^{\tfrac{1}{2}} (2C + 2^{w-2})^{\tfrac{1}{2}} \qquad (71)$$

where "=" may be achieved if and only if formula 72 is true as follows:

$$\frac{m'_l}{p_b^l(1-p_b)^{w-l}} = \sqrt{\frac{2C + 2^{w-2}}{\sum_{j=0}^{w} \binom{w}{j} p_b^{2j}(1-p_b)^{2(w-j)}}} \qquad (72)$$

for $l=0, 1, 2, \ldots, w$.

The enforcement that the number of degrees of freedom to be more than the number of linear constraints yields formula 73 as follows:

$$\frac{\left(n\left(\sqrt{(2C+2^{w-2})\left(\sum_{l=0}^{\hat{u}} \binom{w}{l} p_b^{2l}(1-p_b)^{2(w-l)}\right)} - \frac{1}{2}\right) + (n-d)/2\right)^2}{2(n-d)} - $$

$$\frac{n-d}{8} > nC \qquad (73)$$

Dividing both sides of the formula 73 by C and letting C go to infinity generally yields formula 74 as follows:

$$\sum_{l=0}^{w} \binom{w}{l} p_b^{2l}(1-p_b)^{2(w-l)} > 1 - \frac{d}{n}. \qquad (74)$$

Furthermore, the multiplicities may be per formula 75 as follows:

$$\frac{m'_0}{1-\frac{t}{n}} = \frac{m'_i}{\frac{t}{(2-1)n}} = \sqrt{\frac{2C + 2^{w-2}}{\left(1-\frac{t}{n}\right)^2 (q-1)^2 + \frac{t^2}{n^2}(q-1)}} \qquad (75)$$

for $i=1, 2, \ldots, w$. Thus, the resulting LECC may achieve a similar q-ary Johnson bound. Note that formula 75 is generally a pessimistic multiplicity assignment, therefore, the resulting LECC bound governed by formula 74 may be beyond q-ary Johnson bound.

The QAM modulation may be considered. To ease analysis, each codeword symbol may be considered to be centered in the alphabet, which are generally the most prone to corruption. For t symbols that may be erroneous, an error probability on each dimension, denoted by $p_q$, generally satisfies formula 76 as follows:

$$1 - \frac{t}{n} = (1-2p_q)^2 \Leftrightarrow p_q = \frac{1}{2} - \frac{1}{2}\sqrt{1 - \frac{t}{n}}. \qquad (76)$$

Given a noise distribution, an a posteriori probability that y is received conditioned on the transmission of x, Pr(x|y) may be calculated. A simplification may be made that the corruption only incur to the 8 nearest neighbors, which is a dominant pattern for the typical Gaussian noise. The simplification generally renders the analysis independent of the noise model and loosens an assumption on a transmitted symbol such that the symbol is not on the edge of signal constellation.

Utilizing the methodology, formula 77 may be obtained as follows:

$$\frac{\left(n\left(((1-2p_q)^2 + 2p_q^2)\sqrt{\left(2C + \frac{q}{4}\right)} - \frac{1}{2}\right) + (n-d)/2\right)^2}{2(n-d)} - \frac{n-d}{8} > nC \qquad (77)$$

The associated multiplicities, $m_0$, $m_1$ and $m_2$ may be set per formula 78 as follows:

$$\frac{m_0 + \frac{1}{2}}{(1-2p_q)^2} = \frac{m_1 + \frac{1}{2}}{p_q - 2p_q^2} = \frac{m_2 + \frac{1}{2}}{p_q^2} = \frac{\sqrt{2C + \frac{q}{4}}}{(1-2p_q)^2 + 2p_q^2}. \qquad (78)$$

Accordingly, $p_q$ generally satisfies, with a large enough cost C, formula 79 as follows:

$$((1-2p_q)^2 + p_q^2)^2 > 1 - \frac{d}{n} \qquad (79)$$

Solving formula 79 generally results in formula 80 as follows:

$$((1-2p_q)^2 + p_q^2)^2 > 1 - \frac{d}{n} \qquad (80)$$

which yields formula 81 as follows:

$$t < n\left(1 - \frac{1}{3}\left(1 + \sqrt{6\sqrt{1 - \frac{d}{n}} - 2}\right)\right)^2. \qquad (81)$$

Generally, $p_q$ may be unconstrained and consequently the bound on t may be maximized to t<d when $$6\sqrt{1-\frac{d}{n}}-2<0,$$

for example d/n>8/9. By limiting error corruption to 8 nearest neighbors, a q-ary Reed-Solomon code may be treated as a 9-ary code, which has the natural bound on the minimum distance, d/n≤8/9.

The Chase decoding technique, referred to as a variant of Chase II technique, may flip all combinations of a set of t symbol error patterns. Each time the Chase technique may apply bounded-distance decoding and choose the most likely codeword, if any, among the decoded candidate codewords.

Let c=[$c_1, c_2, \ldots, c_n$] be a transmitted codeword and y=[$y_1, y_2, \ldots, y_n$] be the received channel word. Let u=[$u_1, u_2, \ldots, u_n$] be the hard-decision vector as defined in formula 8. Let $u_{i_l}$, i∈I={$i_1, i_2, \ldots, i_\tau$} be τ (|I|=τ) secondary (or second) most reliable channel decisions, such that formula 82 is satisfied as follows:

$$\pi_{i,u'_i} \geq \pi_{j,i}, i \in I, j \neq u_l \quad (82)$$

A base multiplicity matrix M may be defined by constraint 83 as follows:

$$m_{i,ui}=m_{i,u'_i}, i \in I \quad (83)$$

The term "a" preferred combination may be used where, as the preference is generally subject to the constraint 83. Selection criteria 82 justify that constraint 83 is nearly true.

Multiple (e.g., $2^\tau$) multiplicity matrices for Chase exhaustive flipping may be defined by formula 84 as follows:

$$\begin{cases} m_{i,j}^{(b1,b2,\ldots,b\tau)}=0, & \text{if } i=i_1 \in I, j=u_i, b_1=0 \\ m_{i,j}^{(b1,b2,\ldots,b\tau)}=0, & \text{if } i=i_1 \in I, j=u'_1, b_1=1 \\ m_{i,j}^{(b1,b2,\ldots,b\tau)}=m_{i,j}, & \text{otherwise} \end{cases} \quad (84)$$

where $b_l \in \{0,1\}$ generally denotes the indicator of the l-th flipping symbol, with 0 meaning to bet on $u_{il}$, whereas 1 to bet on $u'_{il}$.

A new reliability matrix Π' may be defined by formula 85 as follows $$\prod' = \begin{cases} \pi'_{i,j}=\pi_{i,j} & \text{if } i \in I, \text{ or } j \neq \{u_i, u'_i\} \\ \pi'_{i,j}=\pi_{i,j}+\pi_{i,u'_i} & \text{if } i \in I, \quad c_i \in \{u_i, u'_i\} \\ \pi'_{i,j}=\pi_{i,j}+\pi_{i,u'_i} & \text{if } i \in I, \quad c_i \neq \{u_i, u'_i\} \\ \pi'_{i,j}=0 & \text{otherwise} \end{cases} \quad (85)$$

and the corresponding multiplicity matrix M' may be defined by formula 86 as follows:

$$M' = \begin{cases} m'_{i,j}=0 & \text{if } i \in I, j \in \{u_i, u'_i\}, \pi'_{i,j}=0 \\ m'_{i,j}=m_{i,j} & \text{otherwise} \end{cases} \quad (86)$$

The reliability matrix Π' is generally unavailable, as the genie information of the transmitted codeword may not be available.

Consider a combination of Chase exhaustive flipping and Koetter-Vardy mutliplicities. Let $M^{(b1,b2,\ldots,b\tau)}$, $b_l \in \{0,1\}$, be $2^\tau$ multiplicity matrices for Chase combinatorial list decoding attempts. Hence, a probability of failure may be similar to the single list decoding with the multiplicity matrix M' over the reliability matrix Π'.

Consider formula 87 as follows:

$$C(M^{(b1,b2,\ldots,b\tau)})=C(M') \quad (87)$$

A matric ΔM' may be defined per formula 88 as follows:

$$\Delta M' = \left\{\delta \in Z: \left(\delta+1-\frac{n-d}{2}\left(\frac{\tilde{a}}{n-d}\right)\right)\left(\left(\frac{\delta}{n-d}\right)+1\right)>C(M')\right\} \quad (88)$$

and the score of a vector v=[$v_1, v_2, \ldots, v_n$] associated with a multiplicity matrix M may be given by formula 89 as follows:

$$S_M(v)=\sum_{i=1}^{n} m_{i,v_i}. \quad (89)$$

Therefore, the transmitted codeword c may be list decodable by the merged multiplicity matrix M' if $S_{M'}(c)>\Delta(M')$.

Due to an exhaustiveness of Chase flipping, a flipping pattern ($b_1, b_2, \ldots, b_\tau$) generally exists per formula 90 as follows:

$$M'=M^{(b1,b2,\ldots,b\tau)} \quad (90)$$

consequently, formula 91 is applicable as follows:

$$S_{M'}(c)=S_M^{(b1,b2,\ldots,b\tau)}(c) \quad (91)$$

A Chase exhaustive flipping may be treated as a single attempt with respect to a merged reliability matrix. Consequently, the base multiplicity matrix M may be obtained by means of a virtual reliability matrix Π", utilizing formula 92 as follows:

$$M=\lfloor \mu \Pi'' \rfloor \quad (92)$$

where μ>1 may be a scalar and Π" is generally defined by formula 93 as follows:

$$\prod'' = \begin{cases} \pi''_{i,j}=\pi_{i,j} & \text{if } i \notin I \text{ or } j \neq \{u_i, u'_i\} \\ p''_{i,j}=\pi_{i,ui}+\pi_{i,u'_i} & \text{if } i \in I, \quad j \in \{u_i, u'_i\} \end{cases} \quad (93)$$

Note that Π" may not be a valid reliability matrix, due to formula 94 as follows:

$$\sum_{j=0}^{q} \pi''_{i,j}=1+\pi_{i,u_i}+\pi_{i,u'_i}>1, i \in I \quad (94)$$

The probability distributions $\pi_{i,ui}$ and $\pi_{i,u'i}$ may be close to 0.5 and thus may be assigned roughly half a maximum multiplicity. On the other hand, Chase flipping essentially merges the two most reliable channel estimations into a unified estimation with almost twice higher reliability, thus the near maximum multiplicities, may be assigned to the chosen estimation and zero to the other estimation.

By enforcing a message polynomial p(x) with zero constant term, $p_0=0$, the decoder complexity may be dramatically reduced at negligible performance degradation. More specifically, a candidate bivariate polynomial Q(x,y) is generally invalid if a constant term is nonzero (e.g., Q(0,0)≠0) and a spurious term has roughly a $q^{-1}$ probability to contain a zero constant term. As a result, the constant term Q(0,0) associated with a Chase flipping pattern may be tracked and the corresponding bivariate polynomial Q(x,y) may be constructed and factorized if Q(0,0)=0. Such enforcement may be similar to reducing a code redundancy by unity (1). The same strategy may be deployed for the proposed general framework of Chase decoding which incorporates Koetter-Vardy varying multiplicity.

For high-rate codes of dominant practical interest, the encoding process utilizing may be less efficient than the an encoding process utilizing linear-feedback-shift-registers (e.g., LFSR), based on a generator polynomial. Thus, a generator polynomial may enable the LFSR encoding.

A subcode of an (n,k) Reed-Solomon code over Fq may be defined such that corresponding message polynomials p(x) satisfy $p_0=0$ and deg(p(x))<k may be an (n,k−1) Reed-Solomon code associated with generator polynomial per formula 95 as follows:

$$G(x)=(x-1)(x-\alpha)(x-\alpha^2)\ldots(x-\alpha^{n-k}) \quad (95)$$

where $\alpha$ may be a primitive element of Fq.

A message polynomial p(x) may have a degree of up to k−1. The primitive (e.g., n=q−1) codeword polynomial c(x) may be given by formula 96 as follows:

$$\begin{aligned} c(x) &= p(1) + p(\alpha)x + p(\alpha^2)x^2 + \ldots + p(\alpha^{q-2})x^{q-2} \\ &= \sum_{i=1}^{k-1} p_i + x\sum_{i=1}^{k-1} p_i\alpha^i + \ldots + x^{q-2}\sum_{i=1}^{k-1} p_i\alpha^{i(q-2)} \\ &= \sum_{i=1}^{k-1} p_i(1 + x\alpha^i + x^2\alpha^{2i} + \ldots + x^{q-2}\alpha^{i(q-2)}) \\ &= \sum_{i=1}^{k-1} p_i \frac{1 - x^{q-1}}{1 - \alpha^i x} \\ &= \sum_{i=1}^{k-1} \alpha^{-i} p_i \frac{(x-1)(x-\alpha)(x-\alpha^2)\ldots(x-\alpha^{q-2})}{x - \alpha^{-i}} \end{aligned} \quad (96)$$

which indicates that c(x) contains (consecutive) roots 1, $\alpha$, $\alpha^2, \ldots, \alpha^{q-1-k}$. The two codes may have the same dimension, k−1.

Figure 8:
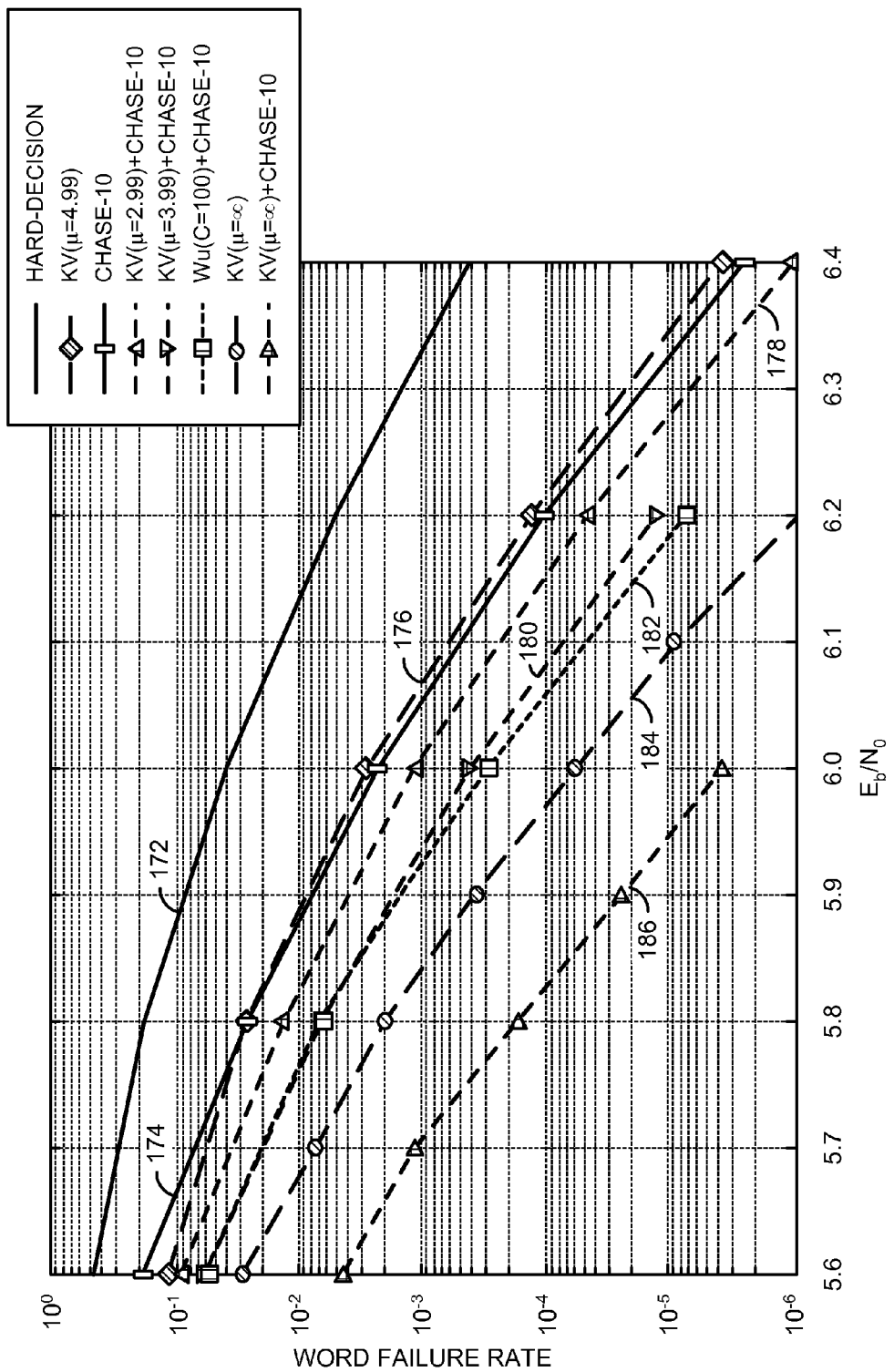
FIG. 8 is a graph of simulation performance comparisons for decoding a (458, 410) Reed-Solomon code under a BPSK modulation.

Referring to FIG. 8 a graph of simulation performance comparisons for decoding a (458, 410) Reed-Solomon code over $F_{2^{10}}$ under a BPSK modulation is shown. A curve 172 may illustrate a hard-decision decode performance. A curve 174 may illustrate a KV($\mu$=4.99) decode performance. Curve 176 generally illustrates a Chase-10 decode performance. A curve 178 may illustrate a KV($\mu$=2.99)+Chase-10 decode performance. Curve 180 generally illustrates a KV($\mu$=3.00)+Chase-10 decode performance. A curve 182 may show a Wu(C=100)+Chase-10 decode performance. Curve 184 generally illustrates a KV($\mu$=infinity) performance. A curve 186 may represent a KV($\mu$=infinity)+Chase-10 performance.

The hard-decision decoding may correct up to 24 errors. The conventional Chase-10 decoding, which systematically flips the 10 most reliable second symbol decisions, may provide a 0.3 dB improvement over hard-decision decoding. The Koetter-Vary technique with a maximum multiplicity 4 generally exhibits similar performance as the Chase-10 decoding. The Koetter-Vary technique with a maximum multiplicity 2 in combination with the Chase-10 flipping may be less complex than the Koetter-Vardy technique with the maximum multiplicity 4, while achieving better performance. The Wu technique with maximum cost of 100 and Chase-10 flipping, generally performs performance and may be less complex than Koetter-Vardy ($\mu$=3.99)+Chase-10 decoding. The performance of the Koetter-Vardy ($\mu$=infinity)+Chase-10 decoding is generally 0.15 dB farther from that of Koetter-Vardy ($\mu$=infinity) alone, which has an approximately 0.5 gain over the hard-decision decoding.

Figure 9:
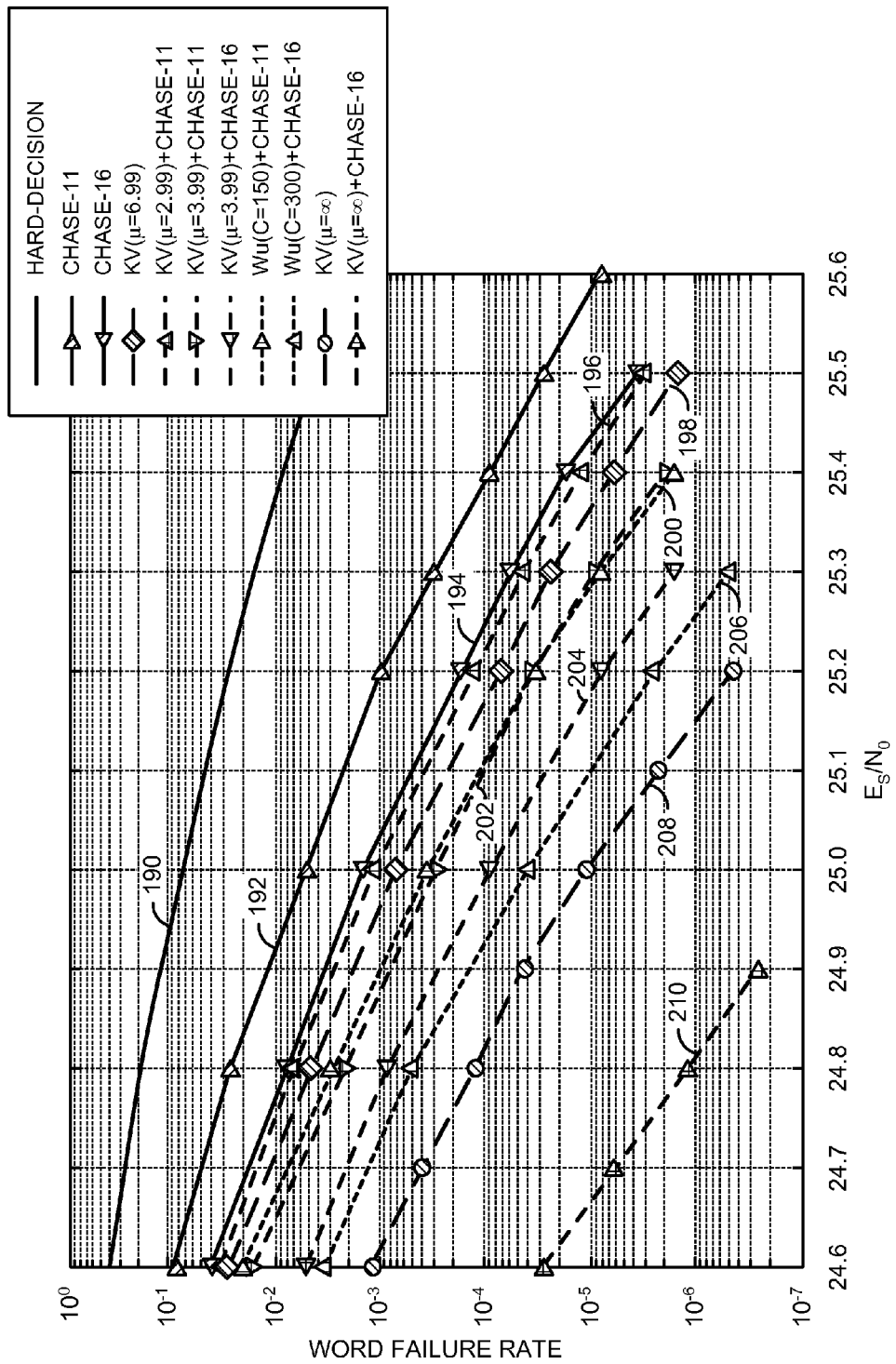
FIG. 9 is a graph of simulation performance comparisons for decoding a (255, 191) Reed-Solomon code under a QAM modulation.

Referring to FIG. 9, a graph of simulation performance comparisons for decoding a (255, 191) Reed-Solomon code over $F_{2^8}$ under a QAM modulation is shown. A curve 190 generally illustrates a hard-decision decode performance. A curve 192 may illustrate a Chase-11 decode performance. Curve 194 generally shows a Chase-16 decode performance. A curve 196 may illustrate a KV($\mu$=6.99) decode performance. A curve 198 may illustrate a KV($\mu$=2.99)+Chase-11 decode performance. Curve 200 generally illustrates a KV($\mu$=3.99)+Chase-11 decode performance. A curve 202 may show a KV($\mu$=3.00)+Chase-16 decode performance. Curve 204 generally illustrates a Wu(C=150)+Chase-11 performance. A curve 206 may represent a Wu(C=300)+Chase 16 decode performance. Curve 208 generally illustrates a KV($\mu$=infinity) performance. A curve 210 may show a KV($\mu$=infinity)+Chase-16 performance.

A Berlekamp-Massey hard-decision technique generally corrects up to 32 errors. The Chase-11 decoding, with a complexity increase by a factor of $2^{11}$=2048, yields about a 0.5 dB improvement over the hard-decision decoding. The Chase-16 decoding, which further scales complexity by a factor of $2^5$=32, generally yields an additional 0.15 dB. The additional gain of Chase decoding may diminish by flipping more and more of the most reliable second symbol decisions. The Koetter-Vardy ($\mu$=3.99)+Chase-11 decoding may exhibit a good performance and is less complex than the Koetter-Vardy technique with $\mu$=6.99. The Koetter-Vardy ($\mu$=3.99)+Chase-16 decoding gains 0.9 dB over the hard-decision decoding and is just 0.2 dB away from the Koetter-Vardy technique with $\mu$=8. The performance of the Koetter-Vardy ($\mu$=infinity)+Chase-16 decoding generally achieves a 0.35 dB improvement over the original Koetter-Vardy ($\mu$=infinity) and a 1.4 dB improvement over the hard-decision decoding performance.

The functions performed by the diagrams of FIGS. 1-4 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. An apparatus comprising:
  a device configured to (i) generate a plurality of probabilities to flip one or more of a plurality of symbols of an encoded codeword based on a plurality of decision values corresponding to said encoded codeword, (ii) generate a modified probability by merging two or more of said probabilities of an unreliable position in said symbols and (iii) generate a decoded codeword by decoding said symbols using an algebraic soft-decision technique in response to said modified probability.

2. The apparatus according to claim 1, wherein (i) said probabilities are generated using a Chase technique and (ii) said algebraic soft-decision technique comprises a Koetter-Vardy technique.

3. The apparatus according to claim 1, wherein said encoded codeword comprises one of (i) a Reed-Solomon encoded codeword and (ii) a BCH encoded codeword.

4. The apparatus according to claim 1, further comprising a circuit configured to generate (i) said symbols and (ii) said decision values both in response to a soft detecting said encoded codeword.

5. The apparatus according to claim 1, wherein said decisions comprise a plurality of hard decisions and a plurality of soft decisions.

6. The apparatus according to claim 5, wherein (i) a first of said probabilities corresponds to one of said hard decisions, (ii) a second of said probabilities corresponds to one of said soft decisions and (iii) said merging comprises adding said first probability and said second probability.

7. The apparatus according to claim 1, wherein (i) said device is further configured to assign a plurality of multiplicities in a plurality of multiplicity matrices in response to said modified probability, and (ii) said algebraic soft-decision technique is based on said multiplicity matrices.

8. The apparatus according to claim 7, wherein (i) said device is further configured to interpolate a bivariate polynomial in response to said multiplicity matrices and (ii) said algebraic soft-decision technique is based on said bivariate polynomial.

9. The apparatus according to claim 1, wherein said device is further configured to flip one or more of said symbols in response to a constant term of a bivariate polynomial being non-zero.

10. The apparatus according to claim 1, wherein said apparatus is implemented as one or more integrated circuits.

11. A method of cyclic code decoding, comprising the steps of:
  (A) generating a plurality of probabilities to flip one or more of a plurality of symbols of an encoded codeword based on a plurality of decision values corresponding to said encoded codeword;
  (B) generating a modified probability by merging two or more of said probabilities of an unreliable position in said symbols; and
  (C) generating a decoded codeword by decoding said symbols using an algebraic soft-decision technique in response to said modified probability.

12. The method according to claim 11, wherein (i) said probabilities are generated using a Chase technique and (ii) said algebraic soft-decision technique comprises a Koetter-Vardy technique.

13. The method according to claim 11, wherein said encoded codeword comprises one of (i) a Reed-Solomon encoded codeword and (ii) a BCH encoded codeword.

14. The method according to claim 11, further comprising the step of:
  generating (i) said symbols and (ii) said decision values both in response to soft detecting said encoded codeword.

15. The method according to claim 11, wherein said decisions comprise a plurality of hard decisions and a plurality of soft decisions.

16. The method according to claim 15, wherein (i) a first of said probabilities corresponds to one of said hard decisions, (ii) a second of said probabilities corresponds to one of said soft decisions and (iii) said merging comprises adding said first probability and said second probability.

17. The method according to claim 11, further comprising the step of:

assigning a plurality of multiplicities in a plurality of multiplicity matrices in response to said modified probability, wherein said algebraic soft-decision technique is based on said multiplicity matrices.

18. The method according to claim 17, further comprising the step of:

interpolating a bivariate polynomial in response to said multiplicity matrices, wherein said algebraic soft-decision technique is based on said bivariate polynomial.

19. The method according to claim 11, further comprising the step of:

flipping one or more of said symbols in response to a constant term of a bivariate polynomial being non-zero.

20. An apparatus comprising:

means for generating a plurality of probabilities in a device to flip one or more of a plurality of symbols of an encoded codeword based on a plurality of decision values corresponding said encoded codeword;

means for generating a modified probability by merging two or more of said probabilities of an unreliable position in said symbols; and means for generating a decoded codeword by decoding said symbols using an algebraic soft-decision technique in response to said modified probability.

* * * * *